(12) United States Patent
Rueb et al.

(10) Patent No.: US 6,997,785 B1
(45) Date of Patent: Feb. 14, 2006

(54) WAFER PLANARIZATION COMPOSITION AND METHOD OF USE

(75) Inventors: Christopher J. Rueb, St. Paul, MN (US); Richard J. Webb, Inver Grove Heights, MN (US); Bhaskar V. Velamakanni, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/020,287

(22) Filed: Dec. 23, 2004

(51) Int. Cl.
*B24B 1/00* (2006.01)

(52) U.S. Cl. .............. 451/41; 451/36; 451/57; 451/63; 451/285; 451/287; 438/692; 156/345.12

(58) Field of Classification Search ................ 451/41, 451/36, 37, 54, 57, 63, 285, 287
See application file for complete search history.

(56) References Cited

U.S. PATENT DOCUMENTS

| | | | |
|---|---|---|---|
| 4,954,142 A | 9/1990 | Carr et al. | |
| 5,735,963 A | 4/1998 | Obeng | |
| 5,769,689 A | 6/1998 | Cossaboon et al. | |
| 5,958,794 A | 9/1999 | Bruxvoort et al. | |
| 6,019,806 A | 2/2000 | Sees et al. | |
| 6,099,604 A | 8/2000 | Sandhu et al. | |
| 6,194,317 B1 * | 2/2001 | Kaisaki et al. | 438/692 |
| 6,322,600 B1 | 11/2001 | Brewer et al. | |
| 6,336,945 B1 | 1/2002 | Yamamoto et al. | |
| 6,350,946 B1 * | 2/2002 | Miyake et al. | 136/252 |
| 6,361,403 B1 | 3/2002 | Kuramochi et al. | |
| 6,436,811 B1 * | 8/2002 | Wake et al. | 438/633 |
| 6,454,820 B1 | 9/2002 | Hagihara et al. | |
| 6,491,843 B1 | 12/2002 | Srinivasan et al. | |
| 6,500,055 B1 | 12/2002 | Adams et al. | |
| 6,508,952 B1 * | 1/2003 | Lee et al. | 252/79.1 |
| 6,524,167 B1 | 2/2003 | Tsai et al. | |
| 6,544,892 B1 | 4/2003 | Srinivasan et al. | |
| 6,579,923 B1 * | 6/2003 | Yarmey et al. | 524/262 |
| 6,612,916 B1 | 9/2003 | Kollodge et al. | |
| 6,620,215 B1 * | 9/2003 | Li et al. | 51/298 |
| 6,726,534 B1 | 4/2004 | Bogush et al. | |
| 6,803,353 B1 * | 10/2004 | Martyak et al. | 510/175 |
| 2003/0017785 A1 | 1/2003 | Ueda et al. | |
| 2003/0148614 A1 | 8/2003 | Simpson et al. | |

* cited by examiner

*Primary Examiner*—Eileen P. Morgan
(74) *Attorney, Agent, or Firm*—Daniel D. Biesterveld

(57) ABSTRACT

A wafer polishing solution and method for polishing a wafer comprising an amino acid and calcium ions or barium ions. The wafer polishing solution can be adjusted to control cut rate and selectivity for modifying semiconductor wafers using a fixed abrasive CMP process.

16 Claims, 1 Drawing Sheet

WAFER PLANARIZATION COMPOSITION AND METHOD OF USE

FIELD OF INVENTION

The present invention relates generally to a composition for modifying an exposed surface of a semiconductor wafer. More particularly, the present invention relates to a composition that can be adjusted to control cut rate and selectivity for modifying semiconductor wafers using a fixed abrasive chemical-mechanical planarization process.

BACKGROUND

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the Annals of the International Institution for Production Engineering Research, (Volume 39/2/1990), pp. 621–635. In each manufacturing step, it is often necessary or desirable to modify or refine an exposed surface of the wafer in order to prepare the wafer for subsequent fabrication or manufacturing steps. For example, semiconductor wafers having shallow trench isolation (STI) structures require planarization of the dielectric material prior to further processing.

One method of modifying or refining exposed surfaces of wafers employs processes that treat a wafer surface with a slurry containing a plurality of loose abrasive particles dispersed in a liquid. Typically this slurry is applied to a polishing pad and the wafer surface is then ground or moved against the pad in order to remove or take off material from the wafer surface. Generally, the slurry also contains agents that chemically react with the wafer surface. This type of process is commonly referred to as a chemical-mechanical planarization (CMP) process.

One limitation of CMP slurries, however, is that the slurry abrasive process must be carefully monitored in order to achieve a desired wafer surface topography. A second limitation is the mess associated with loose abrasive slurries. Another limitation is that the slurries generate a large number of particles that must be removed from the surface of the wafer and disposed of following wafer treatment. Handling and disposal of these slurries generates additional processing costs for the semiconductor wafer fabricator.

An alternative to CMP slurry methods uses an abrasive article to modify or refine a semiconductor surface. A CMP process that uses abrasive articles has been reported, for example, by Bruxvoort et al. in U.S. Pat. No. 5,958,794 and by Kaisaki et al. in U.S. Pat. No. 6,194,317. The reported abrasive articles have a textured abrasive surface that includes abrasive particles dispersed in a binder. In use, the abrasive article is contacted with a semiconductor wafer surface, often in the presence of a fluid or liquid to provide a planar, uniform wafer surface. Use of an abrasive article overcomes some limitations associated with CMP slurries.

The present invention exploits the advantages afforded by the use of abrasive articles to modify surfaces of semiconductor wafers.

SUMMARY

The present invention relates generally to a composition for modifying an exposed surface of a semiconductor wafer. More particularly, the present invention relates to a composition that can be adjusted to control cut rate and selectivity for modifying semiconductor wafers using a fixed abrasive CMP process.

In one aspect, the present invention provides a method for polishing a wafer by providing a wafer comprising a first region comprising silicon dioxide and a second region comprising silicon nitride, contacting the wafer with a three-dimensional, textured, fixed abrasive article comprising a plurality of abrasive particles and a binder, and relatively moving the wafer and the fixed abrasive article in the presence of a liquid medium comprising an amino acid and calcium ions or barium ions. In some embodiments, the amino acid is L-proline or L-histidine.

The compositions and methods of the present invention unexpectedly enhance the performance of chemical mechanical planarization processes that use fixed abrasives rather than polishing pads and slurries. The use of multivalent cations in slurry solutions used for CMP slurry processes is typically avoided, at least in part, because they tend to destabilize the dispersion of the slurry particles. Flocculated slurry particles may lead to scratches on the wafer surface.

In one aspect of the present invention, the use of calcium or barium as the cation increases the cut rate while retaining the selectivity associated with the use of an amino acid, e.g. L-proline, in the working fluid. In some embodiments, the compositions of the present invention can be modified to control the cut rate and selectivity of the chemical mechanical planarization process. In some embodiments, the cation concentration is selected, at least in part, to control cut rate. The cation concentration can be selected to be at least 0.0001 molar, at least 0.001 molar, or at least 0.01 molar.

In some embodiments, the composition of the working fluid is selected, at least in part, to control silicon dioxide to silicon nitride selectivity. The composition can be selected to obtain a silicon dioxide to silicon nitride selectivity of at least 100 or at least 1000.

In another aspect, the present invention provides a working liquid for chemical mechanical planarization of a wafer using a fixed abrasive. In some embodiments, the working liquid comprises at least one amino acid selected from the group consisting of proline and histidine, calcium ions or barium ions having a cation concentration of at least about 0.0001 molar, and a pH in the range of about 9 to about 12.

In another aspect, the present invention provides a wafer planarization system comprising a working fluid according to the present invention and a three-dimensional, textured, fixed abrasive article comprising a plurality of abrasive particles and a binder. In some systems, the abrasive article comprises precisely shaped abrasive composites.

The above summary of the present invention is not intended to describe each disclosed embodiment or every implementation of the present invention. The Figures and the detailed description that follow more particularly exemplify illustrative embodiments.

In the context of the present invention:
"abrasive composite" refers to one of a plurality of shaped bodies that collectively provide a textured, three-dimensional abrasive article comprising abrasive particles and a binder, wherein the abrasive particles may be in the form of abrasive agglomerates;
"fixed abrasive article" refers to an integral abrasive article that is substantially free of unattached abrasive particles except as may be generated during the planarization process;
"precisely shaped abrasive composite" refers to an abrasive composite having a molded shape that is the inverse of the mold cavity that is retained after the composite has been removed from the mold, wherein the composite can be substantially free of abrasive particles protruding beyond the exposed surface of the shape before the abrasive article has been used, as described by Peiper et al. in U.S. Pat. No. 5,152,917;

"selectivity" refers to the ratio of the rate at which a first material (e.g., a dielectric material such as silicon dioxide) can be removed to the rate at which a second material (e.g., a barrier material such as silicon nitride) can be removed during a CMP process;

"textured abrasive article" refers to an abrasive article having raised portions and recessed portions in which at least the raised portions contain abrasive particles and binder;

"three-dimensional abrasive article" refers to an abrasive article having numerous abrasive particles extending throughout at least a portion of its thickness such that removing some of the particles during planarization exposes additional abrasive particles capable of performing the planarization function; and "wafer" refers to a semiconductor wafer in the form of a blank wafer (i.e., a wafer prior to processing for the purpose of adding topographical features such as metallized and insulating areas) or a processed wafer (i.e., a wafer after it has been subjected to one or more processing steps to add topographical features to the wafer surface).

These figures, which are idealized, are not to scale and are intended to be merely illustrative of the present invention and non-limiting.

DETAILED DESCRIPTION

Figure 1:
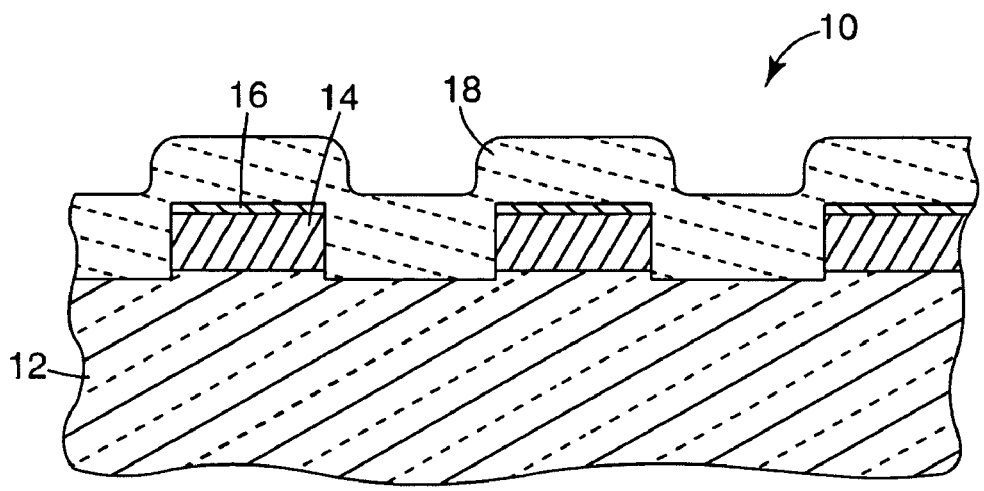
FIG. 1 is a schematic cross-sectional view of a portion of a structured wafer before surface modification.

FIG. 1 is a representative view of a patterned wafer 10 suitable for use in the process according to the present invention. For clarity, known features such as doped regions, active devices, epitaxial layers, carrier and field oxide layers have been omitted. Wafer 10 has a base 12 and a plurality of shallow trench isolation structures 14. The shallow trench isolation structures are typically formed by depositing and patterning a silicon nitride layer 16 to form a mask on the surface of the wafer, and then forming trenches using any of the etching processes known to those skilled in the art.

A dielectric layer 18 is deposited over the surface of the shallow trench isolation structures and into the spaces between the shallow trench isolation structures. A variety of dielectric materials may be used, such as, for example, silicon dioxide. As used in the context of the present invention, "silicon dioxide" refers to silicon dioxide as well as doped variants of silicon dioxide, such as, for example, fluorine, boron, and/or phosphorous doped silicon dioxide.

Figure 2:
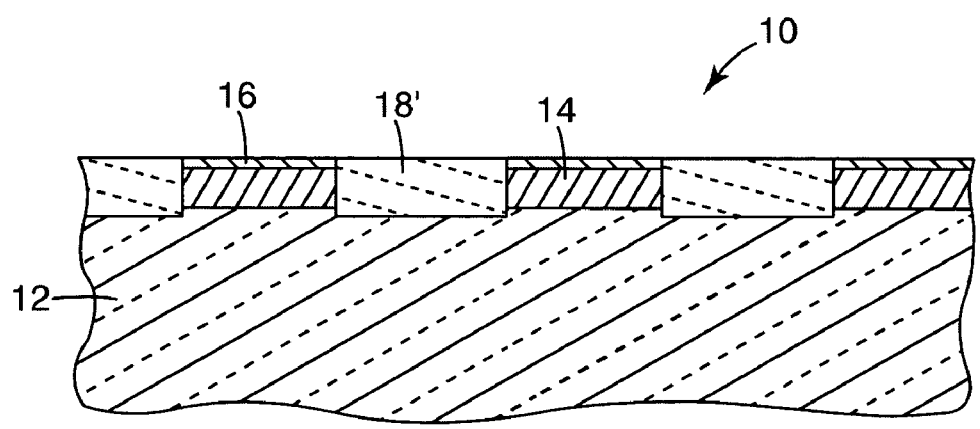
FIG. 2 is a schematic cross-sectional view of the structured wafer of FIG. 1 after surface modification using the present invention.

A portion of the dielectric layer 18 is then removed using the CMP process of the present invention to form the desired pattern illustrated in FIG. 2. As shown in FIG. 2, the polished dielectric material 18' and mask layer 16 form a generally flat surface. The mask layer functions as a stop layer for the CMP process that protects the shallow trench isolation structure 14 from exposure to the CMP processing.

CMP machines useful with the processes of the present invention are commercially available and known to those skilled in the art. An exemplary CMP machine is commercially available from Applied Materials, Santa Clara, Calif. and is marketed under the trade designation "APPLIED MATERIALS MIRRA CMP POLISHER". Alternative CMP machines are available from Obsidian, Inc., Fremont, Calif. and marketed under the trade designation "OBSIDIAN MODEL 501 CMP POLISHER".

The CMP machine useful for the process of the present invention is fitted with a fixed abrasive polishing article as reported, for example, by Bruxvoort et al. in U.S. Pat. No. 5,958,794 and by Kaisaki et al. in U.S. Pat. No. 6,194,317. The abrasive article is used to polish the exposed surface of the wafer in the presence of a liquid medium (i.e., working liquid).

Abrasive articles useful for the method of the present invention typically have a diameter in the range of 250 to 1,000 millimeters.

The abrasive article may rotate between about 5 to 10,000 revolutions per minute. In some embodiments, the abrasive article rotates about 10 to 1,000 revolutions per minute. In some embodiments, the abrasive article rotates between about 10 to 250 revolutions per minute. In yet further embodiments, the abrasive article rotates between about 10 to 60 revolutions per minute.

In some embodiments, the abrasive article and the wafer are rotated in the same direction. In other embodiments, the wafer and the abrasive article are rotated in opposite directions.

The abrasive article can also be provided in other configurations, including, for example, sheets, rolls, or belts. In these configurations, the abrasive article can be fed linearly into the CMP process during polishing operations.

The abrasive article can be selected to be long lasting, e.g., the abrasive article can be selected, at least in part, to polish a minimum number of different wafers. The abrasive article can also be selected based on cut rate. Additionally, the abrasive article can be selected based on its capability of yielding a semiconductor wafer having an desired flatness, surface finish, and minimal dishing. The materials, desired texture, and process used to make the abrasive article can all influence whether or not these criteria are met.

Abrasive articles useful in the CMP process of the present invention include those reported by Bruxvoort et al. in U.S. Pat. No. 5,958,794 and by Kaisaki et al. in U.S. Pat. No. 6,194,317, incorporated herein by reference. In certain embodiments, a three-dimensional, textured, fixed abrasive article is used. In some embodiments, the abrasive article comprises ceria abrasive particles. In yet further embodiments, the abrasive articles comprise precisely shaped abrasive composites.

Exemplary abrasive articles having precisely shaped abrasive composites comprising ceria particles that are useful for the processes of the present invention include those commercially available from 3M Company, St. Paul, Minn., and marketed under the trade designation "3M SLURRYFREE CMP FIXED ABRASIVE 3152" and "3M SLURRYFREE CMP FIXED ABRASIVE 3154".

During CMP processing using the processes of the present invention, a working liquid is present at the interface between the abrasive article and the wafer. Typically, during planarization, there is a consistent flow of the working liquid to the interface between the abrasive article and the wafer. The liquid flow rate typically ranges between about 10 to 10,000 milliliters per minute. In some embodiments, the liquid flow rate is in the range of about 10 to 500 milliliters per minute. In yet further embodiments, the liquid flow rate is between about 25 to 250 milliliters per minute.

The working liquid of the present invention comprises an amino acid and at least one of calcium ions and barium ions. Amino acids useful with the process of the present invention include, for example, glycine, aspartic acid, glutamic acid, histidine, lysine, proline, arginine, cysteine, and tyronsine. In certain preferred embodiments, the working liquid comprises L-proline or histidine.

In some embodiments, the working liquid comprises at least 0.5% amino acid by weight. In some embodiments, the working liquid comprises at least 1% amino acid by weight. In yet further embodiments, the working liquid comprises at least 2% amino acid by weight. In some embodiments, the working liquid comprises about a 2.5% amino acid by weight. In some embodiments, the working liquid comprises less than 8% amino acid by weight. In some embodiments, the working liquid comprises less than 5% amino acid by weight. In yet further embodiments, the working liquid comprises less than 3% amino acid by weight.

The calcium ions or barium ions can be added to the working liquid from a variety of sources, including, for example, salt compounds or salt solutions. The salt can be provided with a variety of anions, including, for example, $Cl^-$, $NO_3^-$, and $OH^-$. Useful salts that can be used to provide the calcium ion concentration in the working liquid of the present invention include, for example, $CaCl_2$ and $Ca(OH)_2$. Useful salts that can be used to provide the barium ion concentration in the working liquid of the present invention include, for example, $BaCl_2$ and $Ba(OH)_2$. Other sources of calcium and barium ions known to those skilled in the art can also be used to formulate the working liquid.

The concentration of calcium ions or barium ions ("cation concentration") useful in the processes of the present invention can be selected to control dielectric (e.g., silicon dioxide) removal rate, dielectric to barrier layer (e.g., silicon dioxide to silicon nitride) selectivity, or a combination thereof. In some embodiments, a working liquid having a cation concentration of at least 0.0001 molar is used. In other embodiments, a working liquid having a cation concentration of at least 0.001 molar is used. In yet further embodiment, a working liquid having a cation concentration of at least 0.01 molar is used.

Processing parameters for the present invention can be selected to achieve desired removal rates and/or selectivity by the skilled person guided by this disclosure. For example, the molarity of the cation and the pH of the working liquid can be adjusted to control the removal rate of the dielectric material. In some embodiments, the molarity of the cation is adjusted to control the removal rate of the dielectric material. In order to determine the molarity of the cation for the desired rate of removal or selectivity, a series of at least two working liquids having differing cation concentrations can be tested to determine the optimal cation concentration. Likewise, in order to determine the working liquid pH for the desired rate of removal or selectivity, a series of at least two working liquids having differing pH levels can be tested to determine the optimal pH level.

In some embodiments, the working liquid is adjusted to a pH of at least about 9. In some embodiments, the working liquid is adjusted to a pH of at least about 10. In some embodiments, the working liquid is adjusted to a pH that is no greater than about 12. In some embodiments, the working liquid is adjusted to a pH that is no greater than about 11. In some embodiments, the working liquid is adjusted to a pH in the range of about 10 to about 11. In some embodiments, the working liquid is adjusted to a pH in the range of about 9 to about 12. The pH can be adjusted using methods and solutions known to those skilled in the art, including, for example, the addition of KOH, NaOH, or $NH_4OH$. In some embodiments, the working liquid is buffered.

In some embodiments, the working liquid is selected to have a dielectric to barrier layer selectivity of at least 100. In other embodiments, the working liquid is selected to have a dielectric to barrier layer selectivity of at least 1000.

In some embodiments, the working liquid is selected to have a dielectric removal rate of at least 1,000 angstroms per minute. In other embodiments, the working liquid is selected to have a dielectric removal rate of at least 1,500 angstroms per minute. In yet further embodiments, the working liquid is selected to have a dielectric removal rate of at least 2,000 angstroms per minute.

Advantages and other embodiments of this invention are further illustrated by the following examples, but the particular materials and amounts thereof recited in these examples, as well as other conditions and details, should not be construed to unduly limit this invention. For example, composition of the working liquid and the cation selection and concentration can be varied. All parts and percentages are by weight unless otherwise indicated.

EXAMPLES

The salts in the following examples are calcium chloride ($CaCl_2$), calcium hydroxide ($Ca(OH)_2$), barium hydroxide octahydrate ($Ba(OH)_2 \cdot 8H_2O$), aluminum chloride ($AlCl_3$), sodium chloride (NaCl), and magnesium chloride hexahydrate ($MgCl_2 \cdot 6H_2O$) (all available from Alfa-Aesar, Ward Hill, Mass.). The material designations shown in TABLE 1 are used throughout the examples.

TABLE 1

| Designation | Material |
|---|---|
| CACL | calcium chloride ($CaCl_2$) |
| CAOH | calcium hydroxide ($Ca(OH)_2$) |
| BAOH | barium hydroxide octahydrate ($Ba(OH)_2$) |
| ALCL | aluminum chloride ($AlCl_3$) |
| NACL | sodium chloride (NaCl) |
| MGCL | magnesium chloride hexahydrate ($MgCl_2.6H_2O$) |
| AA1 | L-proline |
| AA2 | L-histidine |

Examples 1–4 and Comparative Examples 1–7

The following polish tests shown in TABLE 2 were performed on an "OBSIDIAN MODEL 501 CMP POLISHER", obtained from Obsidian, Inc., Fremont, Calif. The abrasive web was "3M BRAND SLURRYFREE CMP FIXED ABRASIVE 3152", available from 3M Company, St. Paul, Minn. The subpad was a "3M BRAND SLURRY-FREE CMP FIXED ABRASIVE P6900 RIBBED SUB PAD", also available from 3M Company. The wafers were 200 millimeter diameter, TEOS oxide coated blanket wafers. Average oxide thickness was measured before and after polishing using a probe marketed under the trade designation "OPTIPROBE MODEL 2600", available from Thermawave, Fremont, Calif.

All polish tests were 60 seconds in duration and performed at a pressure of 20 kilopascals, and a surface speed of 600 millimeters per second. Each data point is an average of the oxide removal rate for at least four wafers polished sequentially. Between each polish test, the abrasive web was rinsed with de-ionized water in the Obsidian 501 rinse station, and then incremented 6 millimeters. Prior to testing each example set for a given chemistry, the abrasive web was rinsed five times in the rinse station.

With the exception of the final chemistry, which did not contain AA1, each polish chemistry was made from an aqueous 2.5% solution of AA1 (available from Alfa-Aesar, Ward Hill, Mass.) to which the salt being tested was added at the level indicated. After the addition of the salt, 1N potassium hydroxide solution was added to increase the pH to 10.5.

TABLE 2

| Example Identification | Composition of Working Liquid | Salt Concentration | Average Removal Rate (Angstroms/minute) |
| --- | --- | --- | --- |
| Comparative 1 | 2.5% AA1 | — | 305 |
| Example 1 | 2.5% AA1 + CACL | 0.0010 M | 2064 |
| Example 2 | 2.5% AA1 + CACL | 0.0100 M | 3061 |
| Example 3 | 2.5% AA1 + CACL | 0.1000 M | 2332 |
| Comparative 2 | 2.5% AA1 + NACL | 0.0030 M | 689 |
| Comparative 3 | 2.5% AA1 + ALCL | 0.0005 M | 550 |
| Comparative 4 | 2.5% AA1 + ALCL | 0.0009 M | 542 |
| Comparative 5 | 2.5% AA1 + ALCL | 0.0090 M | 593 |
| Comparative 6 | 2.5% AA1 + MGCL | 0.0010 M | 510 |
| Comparative 7 | CACL, no AA1 | 0.0010 M | 138 |
| Example 4 | 2.5% AA1 + CAOH | 0.0010 M | 1903 |

At the completion of Example 1, a typical DRAM wafer that had previously been polished to remove all residual oxide from the active areas and expose the underlying silicon nitride was polished under the same conditions as in Example 1. The average amount of nitride removed was 1 Angstrom as measured using the Optiprobe on nine 30 micron by 30 micron active area sites.

Examples 5–7 and Comparative Example 8–14

The following polish tests shown in TABLE were performed on a "MIRRA CMP POLISHER", available from Applied Materials, Santa Clara, Calif. The abrasive web was "3M BRAND SLURRYFREE CMP FIXED ABRASIVE 3154", available from 3M Company, St. Paul, Minn. The subpad was a "3M BRAND SLURRYFREE CMP FIXED ABRASIVE P3900 SUB PAD", also available from 3M Company. The wafers were 200 millimeter diameter, TEOS oxide coated blanket wafers. Average oxide thickness was measured before and after polishing using an Optiprobe model 2600.

All polish tests were 60 seconds long and performed at a pressure of 20 kilopascals, a platen rotation rate of 30 revolutions per minute, and a head rotation rate in the same direction of 28 revolutions per minute. Each data point is an average of the oxide removal rate for four wafers polished sequentially.

With the exception of Comparative Example 11, which did not employ AA1, each polish chemistry was made from a 2.5% solution of AA1, to which the salt being tested was added at the level indicated. After the addition of the salt, 1N KOH solution was added to increase the pH to 10.5. The control solution was 2.5% AA1 adjusted to pH 10.5 with KOH and no additional salt.

TABLE 3

| Example Identification | Composition of Working Liquid | Salt Concentration | Average Removal Rate (Angstroms/minute) |
| --- | --- | --- | --- |
| Comparative 8 | Control | — | 463 |
| Example 5 | 2.5% AA1 + BAOH | 0.01 M | 1135 |
| Comparative 9 | Control | — | 483 |
| Example 6 | 2.5% AA1 + Ca(OH)$_2$ | 0.01 M | 1786 |
| Comparative 10 | Control | — | 706 |
| Comparative 11 | CAOH, no AA1 | 0.01 M | 691 |
| Comparative 12 | Control | — | 597 |
| Comparative 13 | 2.5% AA1 + ALCL | 0.01 M | 235 |
| Comparative 14 | Control | — | 132 |
| Example 7 | 2.5% AA1 + CACL | 0.01 M | 1453 |

Examples 8 and Comparative Example 15

The following polish tests shown in TABLE 4 were performed on an Applied Materials Mirra CMP polisher (obtained from Applied Materials, Santa Clara, Calif.). The abrasive web was 3M M3154 (available from 3M Company, St. Paul, Minn.). The subpad was a "3M BRAND SLURRYFREE CMP FIXED ABRASIVE P3900 SUB PAD", also available from 3M Company. The wafers were 200 millimeter diameter, TEOS oxide coated blanket wafers. Average oxide thickness was measured before and after polishing using an Optiprobe model 2600. All polish tests were 60 seconds in duration and performed at a pressure of 20 kilopascals, a platen rotation rate of 30 revolutions per minute, and a head rotation rate in the same direction of 28 revolutions per minute. Each data point is an average of the oxide removal rate for four wafers polished sequentially. The polish chemistry in Comparative Example 15 was an aqueous solution of 2.5% AA2 in de-ionized water adjusted to pH 10.5 with 1N KOH. The working liquid chemistry in Example 8 was the same as in Comparative Example 15 with the addition of CACL at a concentration of 0.01M.

TABLE 4

| Example Identification | Composition of Working Liquid | Salt Concentration | Average Removal Rate (Angstroms/minute) |
| --- | --- | --- | --- |
| Comparative 15 | 2.5% AA2 | — | 881 |
| Example 8 | 2.5% AA2 + CACL | 0.01 M | 1199 |

It is to be understood that even in the numerous characteristics and advantages of the present invention set forth in above description and examples, together with details of the structure and function of the invention, the disclosure is illustrative only. Changes can be made to detail, especially in matters of the cation concentration in the working liquid and methods of use within the principles of the invention to the full extent indicated by the meaning of the terms in which the appended claims are expressed and the equivalents of those structures and methods.

What is claimed is:
1. A method for polishing a wafer comprising:
providing a wafer comprising a first region comprising silicon dioxide and a second region comprising silicon nitride;
contacting said wafer with a three-dimensional, textured, fixed abrasive article comprising a plurality of abrasive particles and a binder; and relatively moving said wafer and said fixed abrasive article in the presence of a liquid medium comprising an amino acid and cations having a cation concentration, wherein said cations comprise at least one of calcium ions and barium ions.

2. The method of claim 1 wherein said cations comprise calcium ions.

3. The method of claim 1 wherein said amino acid is L-proline.

4. The method of claim 1 wherein said amino acid is L-histidine.

5. The method of claim 1 wherein said cation concentration is at least 0.0001 molar.

6. The method of claim 1 wherein said cation concentration is at least 0.001 molar.

7. The method of claim 1 wherein said cation concentration is at least 0.01 molar.

8. The method of claim 1 wherein said polishing comprises a silicon dioxide to silicon nitride selectivity of at least 100.

9. The method of claim 1 wherein said polishing comprises a silicon dioxide to silicon nitride selectivity of at least 1000.

10. The method of claim 1 further comprising selecting said cation concentration to control at least one of silicon dioxide removal rate and silicon dioxide to silicon nitride selectivity.

11. The method of claim 1 wherein said abrasive particles comprise ceria.

12. The method of claim 1 wherein said three-dimensional, textured, fixed abrasive article comprises precisely shaped abrasive composites.

13. A method for chemical-mechanical polishing a wafer comprising:

providing a wafer comprising silicon dioxide and silicon nitride;

selecting a liquid medium according to at least one of silicon dioxide removal rate and silicon dioxide to silicon nitride selectivity, said liquid medium comprising an amino acid and at least one of calcium ions and barium ions;

contacting said wafer with a three-dimensional, textured, fixed abrasive article comprising a plurality of abrasive particles and a binder;

relatively moving said wafer and said fixed abrasive article; and introducing said liquid medium to at least a portion of said wafer.

14. The method of claim 13 further comprising identifying silicon dioxide removal rate for at least two liquid mediums having different cation concentrations.

15. The method of claim 13 further comprising adjusting the pH level of the liquid medium to control at least one of silicon dioxide removal rate and silicon dioxide to silicon nitride selectivity.

16. The method of claim 13 wherein said amino acid is L-proline.

* * * * *